United States Patent [19]
Simon et al.

[11] Patent Number: 5,523,282
[45] Date of Patent: * Jun. 4, 1996

[54] HIGH-FREQUENCY SUBSTRATE MATERIAL FOR THIN-FILM LAYERED PEROVSKITE SUPERCONDUCTORS

[75] Inventors: Randy W. Simon, Long Beach; Christine E. Platt, El Segundo; Alfred E. Lee, Torrance; Gregory S. Lee, West Los Angeles, all of Calif.

[73] Assignee: TRW Inc., Redondo Beach, Calif.

[ * ] Notice: The term of this patent shall not extend beyond the expiration date of Pat. No. 5,523,283.

[21] Appl. No.: 233,637

[22] Filed: Aug. 18, 1988

[51] Int. Cl.$^6$ ................................................. B32B 9/00
[52] U.S. Cl. .......................... 505/1; 428/688; 428/702; 505/701; 505/702; 505/237; 505/238
[58] Field of Search .................... 357/5; 505/866, 505/856, 855, 817, 1, 701–4, 239, 238, 237; 333/247, 995, 238; 428/688, 689, 702; 257/33, 35

[56] References Cited

U.S. PATENT DOCUMENTS

| | | | |
|---|---|---|---|
| 4,421,785 | 12/1983 | Kroger | 357/5 |
| 4,851,794 | 7/1989 | Williams et al. | 333/247 |
| 4,962,087 | 10/1990 | Belt et al. | 505/1 |
| 5,024,894 | 6/1991 | Chien | 505/701 |
| 5,030,613 | 7/1991 | Chai | 505/1 |
| 5,126,315 | 6/1992 | Nishino | 505/1 |
| 5,159,413 | 10/1992 | Calviello | 505/1 |
| 5,256,635 | 10/1993 | Sheng et al. | 505/1 |

FOREIGN PATENT DOCUMENTS

| | | |
|---|---|---|
| A0345441 | 12/1989 | European Pat. Off. |
| 6417314 | 1/1989 | Japan . |
| 9001809 | 2/1990 | WIPO . |

OTHER PUBLICATIONS

"Superconductors' Material Problems," Science, vol. 240 Apr. 1, 1988, pp. 25–27.
"Crystal Growth" by Pamplin ed. 1975, pp. 248–249.
LaGaO3 substrates for epitaxial high Tc SC thin films Sandstrom et al. Appl. Phys. Letts vol. 53, No. 19 pp. 18746 Jul. 11, 1988.
Brown, R., et al., "Low–loss Substrate for Microwave Application of High–temperature Superconductor Films," *Applied Physics Letter*, 57(13):1351–1353 (1990).
Cava, R. J., et al., "Bulk Superconductivity at 36K in $La_{1.8}Sr_{0.2}CuO_4$," *The American Physical Society, Physical Review Letters*, 58(4):408–410 (Jan. 26, 1987).
Edelstein, et al., "Formation of the Structure of the Superconducting Phase of La–Sr–Cu–O by DC Sputtering," *J. Crystl. Growth*, 85:619 (1987).
Fulton, T. A., et al., "The Flux Shuttle—A Josephson Junction Shift Register Employing Single Flux Quanta," *Proceedings of the IEEE*, 61(1):28–35 (1973).

(List continued on next page.)

*Primary Examiner*—Patrick J. Ryan
*Assistant Examiner*—Patrick Jewik

[57] ABSTRACT

A lanthanum aluminate ($LaAlO_3$) substrate on which thin films of layered perovskite copper oxide superconductors are formed. Lanthanum aluminate, with a pseudo-cubic perovskite crystal structure, has a crystal structure and lattice constant that closely match the crystal structures and lattice constants of the layered perovskite superconductors. Therefore, it promotes epitaxial film growth of the superconductors, with the crystals being oriented in the proper direction for good superconductive electrical properties, such as a high critical current density. In addition, $LaAlO_3$ has good high frequency properties, such as a low loss tangent and low dielectric constant at superconductive temperatures. Finally, lanthanum aluminate does not significantly interact with the superconductors. Lanthanum aluminate can also used to form thin insulating films between the superconductor layers, which allows for the fabrication of a wide variety of superconductor circuit elements.

9 Claims, 1 Drawing Sheet

OTHER PUBLICATIONS

Geller, S., "Crystallographic Studies of Perovskite–like Compounds. Rare Earth Scandates, Vanadites, Galliates, Orthochromites," *Acta Cryst.*, 10:243–251 (1957).

Gurvitch, M., et al., "Preparation and Substrate Reactions of Superconducting Y–Ba–Cu–O Films," *Appl. Phys. Lett.*, 51(13):1027–1029 (1987).

Gulyaev, Yu V., et al., "$YBa_2Cu_3O_{7-x}$ Films with a High–temperature Superconductivity Synthesized by Magnetron Sputtering," *Sov. Tech. Phys. Lett.*, 14(4), Apr. 1988.

Hohler, A., et al., "Fully Textured Growth of $Y_1Ba_2Cu_3O_{7-\delta}$ Films by Sputtering on $LiNbO_3$," *Appl Phys. Lett.*, 54(11):1066–1067 (1989).

Holstein, W. L., et al., "Effect of Single Crystal Substrates on the Growth and Properties of Superconducting $Tl_2Ba_2CaCu_2O_8$ Films," *J. Mater. Res.*, vol. 8, No. 5, May 1993.

Koren, G., et al., "Epitaxial Films of $YBa_2Cu_3O_{7-\delta}$ on $NdGaO_3$, $LaGaO_3$, and $SrTiO_3$ Substrates Deposited by Laser Ablation," *Applied Physics Letter*, 54(11):1054–1056 (1989).

Kumar, Ashok, et al., "Textured Superconducting Thin Films of Bismuth Caprate by Laser Ablation Method," *Mat. Res. Soc. Symp. Proc.*, vol. 169 1990.

Lee, A. E., et al., "Epitaxially Grown Sputtered $LaAlO_3$ Films," *Applied Physics Letter*, 57(19):2019–2021 (1990).

Mannhart, J., et al., "Micropatterning of High $T_c$ Films with an Excimer Laser," *Appl. Phys. Lett.*, 52(15):11, Apr., 1988.

Sandstrom, R. L., et al., "Lanthanum Gallate Substrates for Epitaxial High–temperature Superconducting Thin Films," *Applied Physics Letter*, 53(19):1874–1876 (1988).

Scott, W. B., "U.S to Push Aerospace Research, but May Stymie Efforts to Export Products," *Aviation Week & Space Technology*, (Mar. 16, 1992), pp. 39–40.

Simon, R. W., et al., "Growth of High–temperature Superconductor Thin Films On Lanthanum Aluminate Substrates," TRW Space and Technology Group.

Simon, R. W., et al., "Improvement of Average Film Quality in $RBa_2Cu_3O_{7-x}$ Sputtered Films," *IEEE Transactions on Magnetics*, vol. 25, No. 2, Mar. 1989.

Simon, R. W., et al., "Low–loss Substrate for Epitaxial Growth of High–temperature Superconductor Thin Films," *Applied Physics Letters*, vol. 53, No. 26, Dec., 1988.

Takemoto, J. H., "Microstrip Resonators and Filters Using High–TC Superconducting Thin Films on $LaAlO_3$," TRW Space and Technology Group (1990).

International Search Report, European Patent Office, IPC H 01 L 39/24, Nov. 28, 1989.

C. Brandle et al., "Czochralski Growth of $LaAlO_3$," Final Report, Union Carbide, Jul. 29, 1966.

D. Taylor, "Thermal Expansion Data," Journal, vol. 84, No. 6, 1985.

S. Yajima et al., "Synthesis of Lanthanoid Aluminates Using Arc Plasma Flame," Chemistry Letters, pp. 1331–1334, 1973.

E. Fritsche et al., "Liquidus in the Alumina–Rich System $La_2O_3$–$Al_2O_3$," Journal of The American Ceramic Society, vol. 50, No. 3, pp. 167–168, 1967.

T. Maidukova et al., "Formation of Lanthanum Aluminate in the Coprecipitation of Carbonate and Hydroxide Compounds of Lanthanum and Aluminum," Russian Journal of Inorganic Chemistry, vol. 22, No. 11, pp. 1622–1625, 1977.

S. Geller et al., "Crystallographic Studies of Perovskite–like Compounds. II. Rare Earth Aluminates," Acta Cryst., vol. 9, pp. 1019–1025, 1956.

J. Kilner et al., "Electrolytes for the High Temperature Fuel Cell; Experimental and Theoretical Studies of the Perovskite $LaAlO_3$," Journal of Power Sources, vol. 3, pp. 67–80, 1978.

R. Belt et al., "Investigation of $LaAl_{1-x}Sc_xO_3$ for a Laser Host," Journal of Crystal Growth, vol. 70, pp. 471–475, 1984.

K. Muller, "Critical Phenomena Near Structural Phase Transitions Studied by EPR," Ferroelectrics, vol. 7, pp. 17–21, 1974.

O. Yamaguchi et al., "New Compound in the System $La_2O_3$—$Al_2O_3$," Journal of The American Ceramic Society, vol. 68, No. 2, pp. C44–C45, Feb. 1985.

R. Ropp et al., "The Nature of the Alumina–Rich Phase in the System $La_2O_3$—$Al_2O_3$," vol. 61, No. 11–12, pp. 473–475, Nov.–Dec. 1978.

R. Ropp et al., "Solid–State Kinetics of $LaAl_{11}O_{18}$," Journal of The American Ceramic Society, vol. 63, No. 7–8, pp. 416–419, Jul.–Aug. 1980.

P. Kotru et al., "Optical Microscopic Studies on Grown and Etched Surfaces of Flux Grown $LaAlO_3$ Crystals," Journal of Materials Science, vol. 20, pp. 3365–3374, 1985.

F. Laville et al., "Optical and ESR Investigations of Lanthanum Aluminates $LaMg_{1-x}Mn_xO_{19}$ Single Crystals with Magneto–plumbite–like Structure," Journal of Solid State Chemistry, vol. 49, pp. 180–187, 1983.

N. Menyhard, "Multicritical Behavior in $LaAlO_3$," Solid State Communications, vol. 52, No. 1, pp. 31–35, 1984.

M. Faucher et al., "Optical Study of $LaAlO_3$:Eu at Temperatures Approaching Rhombohodric Cubic Transition," vol. 63, No. 1, pp. 446–454, Jul. 1, 1975.

J. Bednorz et al., "Phase Diagram of the $(LaAlO_3)_{1-x}(SrTiO_3)_x$ Solid–Solution System, For x less than 0.8," Mat. Res. Bulletin, vol. 18, pp. 181–187, 1983.

S. Smith et al., "The Growth of $LaAlO_3$ Crystals Enriched in Isotope $^{17}O$," Journal of Crystal Growth, vol. 47, pp. 315–316, 1979.

Hideomi Koinuma et al, "Some Problems In The Prepration Of Superconducting Oxide Films On Ceramic Substrates", Japanese Journal Of Applied Physics, vol. 26, No. 5, May 1987, pp. L763–L765.

Takuya Hashimoto et al, "Thermal Expansion Coefficients Of High–Tc Superconductors", Japanese Journal Of Applied Physics, vol. 27, No. 2, Feb. 1988 pp. L214–L216.

"Chemical Interaction Between $BA_2YCu_3O_{7-\delta}$ And Substrate Materials In Th Solid State", Hideomi Koinuma et al, Japanese Journal Of Applied Physics, vol. 27, No. 7, Jul. 1988, pp. L1216–L1218.

Doss, "Engineer's Guide to High Temperature Superconductivity," Wiley & Sons, 1989, pp. 104–105, 106–109, 152–157.

Gabelle "Paths to Higher Temperature Superconductors" Science, vol. 259, Mar. 12, 1993 pp. 1550, 1551.

"Theoretical Resistance," Scientific Amer., Dec. 1992, pp. 24–25.

"Cuprate Superconductivity, Record 133K achieved with Mercury," May 10, 1993, C & EN pp. 4, 5.

HIGH-FREQUENCY SUBSTRATE MATERIAL FOR THIN-FILM LAYERED PEROVSKITE SUPERCONDUCTORS

BACKGROUND OF THE INVENTION

This invention relates generally to layered perovskite superconductors and, more particularly, to substrates on which layered perovskite superconductors are deposited to form high-frequency electronic devices and circuits.

Materials exhibiting superconductivity at temperatures above the advantageous liquid-nitrogen temperature of 77° K were discovered only recently and have triggered a world-wide explosion in scientific and technological research. The first material to exhibit superconductivity above the temperature of liquid nitrogen was an oxygen-depleted layered perovskite compound of yttrium, barium, copper and oxygen, identified by the formula $Y_1Ba_2Cu_3O_7$. Since this discovery, other similar layered perovskite copper oxide compounds, identified by the formula $R_1Ba_2Cu_3O_7$, where R is a rare earth element, have also been found to be superconductive at temperatures above the liquid-nitrogen temperature. This particular group of layered perovskite superconductors is commonly referred to as "1-2-3" compounds, because of the number of atoms of each metal element in the copper oxide compound.

Still other layered perovskite copper oxide compounds, with even higher critical temperatures (the temperature at which superconductivity occurs), have been more recently discovered. These newer compounds contain four metallic elements instead of the three metallic elements contained in the "1-2-3" compounds, and they do not contain a rare earth element. In place of the rare earth element, these newer compounds contain metals such as bismuth or thallium.

The major advantage of the layered perovskite superconductors is that superconductive temperatures can be maintained using liquid nitrogen, which is considerably less expensive and troublesome than using liquid helium, as required in the past. Therefore, these superconductors can be expected to find many new applications. One major application already being investigated is integrated circuits, in which thin films of these new superconductors are deposited on substrates to form, for example, Josephson junctions, waveguides and microwave transmission lines. These superconductor circuit elements can be combined to form high-speed, high-frequency and low-power integrated circuits with unparalleled performance.

However, thin films of the layered perovskite superconductors can only be grown with optimal properties on substrates having crystal structures and lattice constants that closely match those of the superconductors. Strontium titanate (SrTiO3) is one such material, and is currently being used as a substrate. Unfortunately, strontium titanate is unsuitable at high frequencies because it is very lossy and has an extremely high dielectric constant at superconductive temperatures. Accordingly, there has been a need for a substrate material having good high frequency characteristics and a crystal structure and lattice constant that closely match the crystal structures and lattice constants of the layered perovskite superconductors. The present invention clearly fulfills this need.

SUMMARY OF THE INVENTION

The present invention resides in a substrate of lanthanum aluminate ($LaAlO_3$) on which thin films of layered perovskite copper oxide superconductors are formed. Lanthanum aluminate, with a pseudo-cubic perovskite crystal structure, has a crystal structure and lattice constant that closely match the crystal structures and lattice constants of the layered perovskite superconductors. Therefore, it promotes epitaxial film growth of the superconductors, with the crystals being oriented in the proper direction for good superconductive electrical properties, such as a high critical current density. In addition, $LaAlO_3$ has good high frequency properties, such as a low loss tangent and low dielectric constant at superconductive temperatures. Finally, lanthanum aluminate does not significantly interact with the superconductors. Lanthanum aluminate can also be used to form thin insulating films between the superconductor layers, which allows for the fabrication of a wide variety of superconductor circuit elements.

It will be appreciated from the foregoing that the present invention represents a significant advance in the field of superconductors. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENTS

Figure 1:
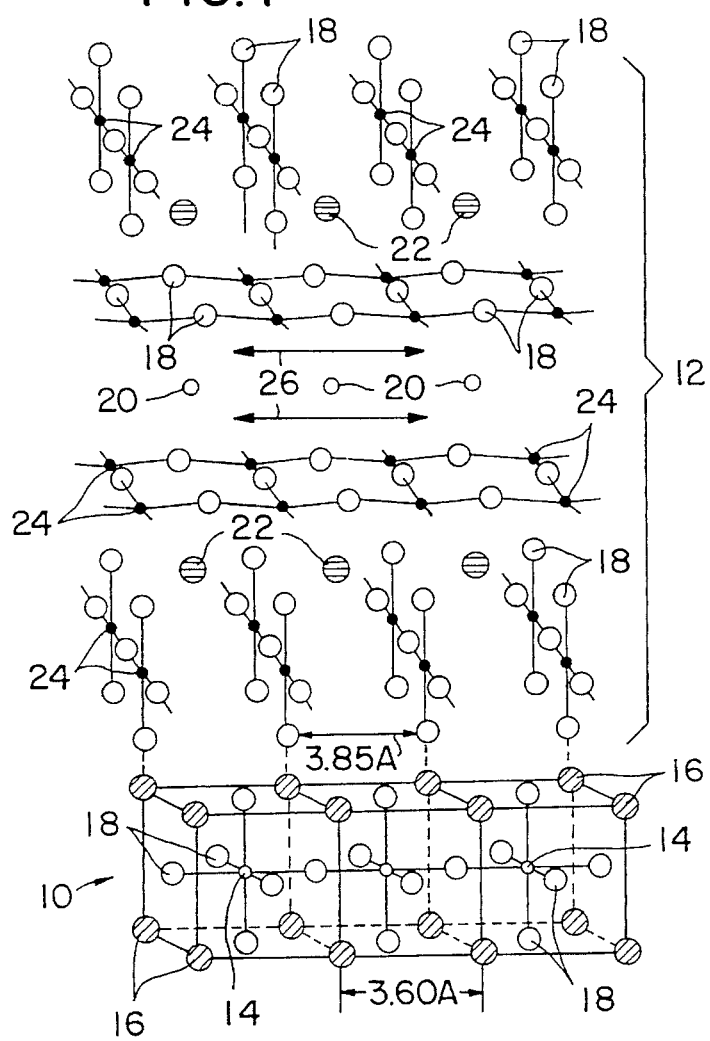
FIG. 1 illustrates the crystalline structure of a lanthanum aluminate ($LaAlO_3$) substrate on which is deposited a thin film of a layered perovskite superconductor having the formula $Y_1Ba_2Cu_3O_7$.

As shown in the drawings for purposes of illustration, the present invention is embodied in a substrate of lanthanum aluminate ($LaAlO_3$) on which thin films of layered perovskite copper oxide superconductors are formed. Lanthanum aluminate, with a pseudo-cubic perovskite crystal structure, has a crystal structure and lattice constant that closely match the crystal structures and lattice constants of the layered perovskite superconductors. Therefore, it promotes epitaxial film growth of the superconductors, with the crystals being oriented in the proper direction for good superconductive electrical properties, such as a high critical current density. In addition, $LaAlO_3$ has good high frequency properties, such as a low loss tangent and low dielectric constant at superconductive temperatures. Finally, lanthanum aluminate does not significantly interact with the superconductors. Lanthanum aluminate can also be used to form thin insulating films between the superconductor layers, which allows for the fabrication of a wide variety of superconductor circuit elements.

Figure 2:
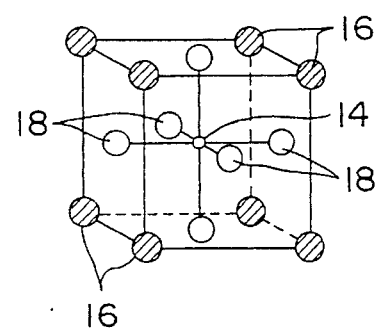
FIG. 2 illustrates the unit cell structure of lanthanum aluminate.

FIG. 1 illustrates the structure of a lanthanum aluminate substrate 10 on which is deposited a thin film of a layered perovskite superconductor 12 having the formula $Y_1Ba_2Cu_3O_7$. As shown in FIGS. 1 and 2, each unit cell of lanthanum aluminate includes one atom of lanthanum 14, one atom of aluminum 16 and three atoms of oxygen 18.

Although the unit cell is shown as including many more aluminum and oxygen atoms, the aluminum and oxygen atoms are actually shared with adjacent unit cells. As shown in FIG. 1, each unit cell of the layered perovskite copper oxide superconductor includes one atom of yttrium 20, two atoms of barium 22, three atoms of copper 24 and seven atoms of oxygen 18. Because the lattice constant of $LaAlO_3$ is approximately 3.80 angstroms and the lattice constant of the layered perovskite superconductor is approximately 3.85 angstroms, and because the crystalline structures of the two compounds are closely matched, the crystals of the layered perovskite superconductor orient themselves with the crystals of the lanthanum aluminate, thus providing high superconductive current flow in the direction of the arrows 26 shown in FIG. 1.

As shown in FIG. 1, the layered perovskite superconductor forms as layers of copper 24 and oxygen 18 atoms sandwiched between layers containing the other elements in the compound. Some of the copper-oxygen layers include planes of the atoms while other layers include chains of alternating copper and oxygen atoms. The layers containing the copper and oxygen atoms are the important layers for determining the superconductive electrical properties of the compound. Because the copper-oxygen layers are asymmetrically positioned in the unit cell, the compound is anisotropic in all of its electrical properties. This is why the ability of the superconductor to carry current is strongly dependent on its orientation.

The anisotropy of the layered perovskite superconductors is not the only problem caused by the complex chemistry and structure of these compounds. Each compound contains chemically reactive components, particularly barium, that strongly react with other substances. In addition, the compounds must be formed at very high temperatures, in the range of 700° to 950° C., to incorporate enough oxygen into the copper-oxygen layers to produce the proper crystalline structure. These high temperatures worsen the chemical reaction problems with the substrates upon which the thin films are deposited. One of the major advantages of $LaAlO_3$ as a substrate material is that it does not significantly interact with the superconductors. Furthermore, it must undergo a large amount of chemical substitution before it loses its insulating properties.

Another of the major advantages of $LaAlO_3$ is its high frequency characteristics. The dielectric constant of $LaAlO_3$ is less than 20, compared with 300 at room temperature and 18,000 at 4.2° K (liquid-helium temperature) for $SrTiO_3$. The loss tangent of $LaAlO_3$ is $8 \times 10^{-5}$ at 77° K and $5 \times 10^{-6}$ at 4.20K, which is comparable to that of sapphire.

Figure 3:
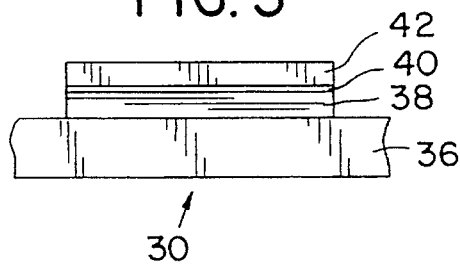
FIG. 3 is a fragmentary, sectional view of a Josephson junction in accordance with the present invention.
Figure 4:
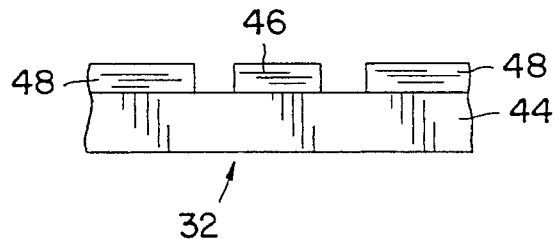
FIG. 4 is a fragmentary, sectional view of a coplanar waveguide in accordance with the present invention.
Figure 5:
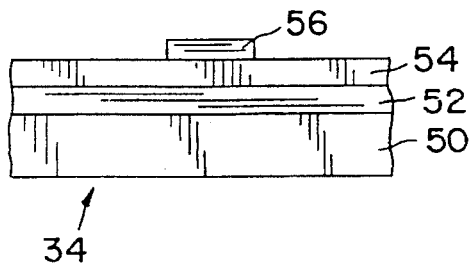
FIG. 5 is a fragmentary, sectional view of a microstrip transmission line in accordance with the present invention.

FIGS. 3, 4 and 5 illustrate the use of $LaAlO_3$ as a substrate and as an insulating layer in several microwave circuit elements fabricated from thin films of layered perovskite copper oxide superconductors. FIG. 3 illustrates a Josephson junction 30, FIG. 4 illustrates a coplanar waveguide 32 and FIG. 5 illustrates a microstrip transmission line 34. As shown in FIG. 3, the Josephson junction 30, which is the fundamental building block of superconductor electronics, includes a $LaAlO_3$ substrate 36, a thin film of layered perovskite superconductor 38 deposited on the substrate 36, a very thin insulating film 40 of $LaAlO_3$ deposited on the superconductor film 38, and another thin film of layered perovskite superconductor 42 deposited on the insulating film 40. The two superconductor films 38, 42 are the electrodes of the Josephson junction 30 and the insulating film 40 is the barrier through which tunneling occurs. In order for tunneling to occur, the insulating film 40 must be very thin, on the order of 20–30 angstroms.

As shown in FIG. 4, the coplanar waveguide 32 includes a $LaAlO_3$ substrate 44 on which are deposited a narrow thin film of layered perovskite superconductor 46 and two wide thin films of layered perovskite superconductor 48 on either side of the narrow superconductor film 46. The narrow superconductor film 46 is the conductor of the waveguide 32 and the two wide superconductor films 48 are the walls of the waveguide.

As shown in FIG. 5, the microstrip transmission line 34 includes a $LaAlO_3$ substrate 50, a thin film of layered perovskite superconductor 52 deposited on the substrate 50, a thin insulating film 54 of $LaAlO_3$ deposited on the superconductor film 52, and a narrow thin film of layered perovskite superconductor 56 deposited on the insulating film 54. The superconductor film 52 is the ground plane of the microstrip transmission line 34, the insulating film 54 is the dielectric and the superconductor film 56 is the conductor. In this device, the insulating film 54 is on the order of thousands of angstroms thick, rather than tens of angstroms, as in the Josephson junction 30. The microstrip transmission line 34 provides nearly dispersionless, low-loss transport of high-frequency electrical signals.

The thin insulating films of lanthanum aluminate and the thin films of the layered perovskite superconductors can be deposited onto the $LaAlO_3$ substrate by one of two basic processes, both of which are conventional. One of the processes starts with the superconductor compound and then deposits the compound by one of several methods onto the substrate. The other process starts with the constituent elements and actually forms the compound on the substrate. The first process is the easiest to perform, which starts with a pellet of the compound. The pellet is atomized in such a way that the liberated superconductor material lands on the substrate and forms a thin film coating. The pellet can be atomized using, for example, a laser (laser ablation), a stream of ions of a nonreactive gas such as argon (sputter deposition) or a vapor spray nozzle.

From the foregoing, it will be appreciated that the present invention represents a significant advance in the field of superconductors. Although several preferred embodiments of the invention have been shown and described, it will be apparent that other adaptations and modifications can be made without departing from the spirit and scope of the invention. For example, rare earth chromates and other rare earth aluminates having lattice constants within a few percent of the lattice constants of the layered perovskite superconductors should also be suitable substrates, providing the compounds do not significantly interact with the superconductors, the compounds have good high frequency characteristics and the compounds are non-ferromagnetic and non-ferroelectric. Accordingly, the invention is not to be limited, except as by the following claims.

We claim:

1. A superconductor device comprising:
   (a) a substrate of lanthanum aluminate; and
   (b) at least one film of erbium barium copper oxide superconductor deposited on the substrate.

2. A superconductor device comprising:
   (a) a substrate of lanthanum aluminate; and
   (b) at least one film of yttrium barium copper oxide superconductor deposited on the substrate.

3. A superconductor device comprising:
   (a) a substrate of lanthanum aluminate; and
   (b) at least one film of a superconductor deposited on the substrate, the superconductor comprising barium, copper, oxygen, and an element selected from the group consisting of lanthanum, neodymium, samarium, europium, gadolinium, terbium, dysprosium, holmium, thulium, ytterbium, lutetium, and thallium.

4. A superconductor device comprising:
 (a) a substrate of lanthanum aluminate; and
 (b) at least one film of a superconductor deposited on the substrate, the superconductor comprising strontium, calcium, copper, oxygen and an element selected from the group consisting of thallium and bismuth.

5. A superconductor device comprising:
 (a) a substrate of lanthanum aluminate; and
 (b) at least one film of a superconductor deposited on the substrate, the superconductor comprising barium, calcium, copper, oxygen, and thallium.

6. The superconductor device of any one of claims 1, 2, 3, 4, and 5 wherein the superconductor comprises a layered perovskite structure.

7. The superconductor device of any one of claims 1, 2, 3, 4, and 5 wherein the crystalline structure and lattice constant of the superconductor film substantially matches the crystalline structure of the substrate, and wherein the crystalline structure of the superconductor film is substantially oriented to the crystalline structure of the substrate.

8. The superconductor device of any one of claims 1, 2, 3, 4, and 5 wherein the lanthanum aluminate substrate has a lattice constant ranging from about 3.80 to about 3.85 Å.

9. The superconductor device of any one of claims 1, 2, 3, 4, and 5 wherein the superconductor film is deposited on the substrate at temperatures of at least about 700° C., and wherein there is substantially no chemical interaction between the superconductor film and the substrate.

* * * * *

UNITED STATES PATENT AND TRADEMARK OFFICE
CERTIFICATE OF CORRECTION

PATENT NO. : 5,523,282
DATED : June 4, 1996
INVENTOR(S) : Randy W. Simon, et al.

It is certified that error appears in the above-indentified patent and that said Letters Patent is hereby corrected as shown below:

On the title page, item "[*] Notice:" and the disclaimer notice should be deleted.

Signed and Sealed this

Seventeenth Day of December, 1996

Attest:

BRUCE LEHMAN

Attesting Officer     Commissioner of Patents and Trademarks